(12) United States Patent
Takagi

(10) Patent No.: US 6,734,429 B2
(45) Date of Patent: May 11, 2004

(54) ELECTRON MICROSCOPE CHARGE-UP PREVENTION METHOD AND ELECTRON MICROSCOPE

(75) Inventor: Shigenori Takagi, Osaka (JP)

(73) Assignee: Keyence Corporation, Osaka (JP)

(*) Notice: Subject to any disclaimer, the term of this patent is extended or adjusted under 35 U.S.C. 154(b) by 0 days.

(21) Appl. No.: 10/395,263

(22) Filed: Mar. 25, 2003

(65) Prior Publication Data

US 2003/0193024 A1 Oct. 16, 2003

(30) Foreign Application Priority Data

Apr. 11, 2002 (JP) .................................... P.2002-109024

(51) Int. Cl.[7] .......................... H01J 32/82; G01N 23/22
(52) U.S. Cl. ....................... 250/310; 250/306; 250/307; 250/311
(58) Field of Search ................................ 250/310, 311, 250/306, 307

(56) References Cited

U.S. PATENT DOCUMENTS 6,114,695 A * 9/2000 Todokoro et al. ........... 250/310
6,653,634 B1 * 11/2003 Otaka et al. ................ 250/311

FOREIGN PATENT DOCUMENTS

| JP | 5-343021 | 12/1993 |
| JP | 7-014537 | 1/1995 |
| JP | 10-012684 | 1/1998 |

* cited by examiner

*Primary Examiner*—Nikita Wells
(74) *Attorney, Agent, or Firm*—Morgan, Lewis & Bockius LLP

(57) ABSTRACT

Eliminating charge of the specimen is performed by applying an acceleration voltage to an electron gun and applying primary electrons to a charged-up specimen from the electron gun. The maximum value of the acceleration voltages of the primary electrons applied in the past is adopted as charge elimination start acceleration voltage. The acceleration voltage is gradually dropped from the charge elimination start voltage so as to emit electrons charged on the specimen. The acceleration voltage is applied continuously until the specimen charged negatively becomes uncharged or is charged positively. A plurality of specimens are previously compared with respect to the acceleration voltage at which the secondary electron emission efficiency becomes 1 and charge elimination termination voltage at which dropping the acceleration voltage is terminated is set to the minimum acceleration voltage or less.

11 Claims, 7 Drawing Sheets

FIG. 5

|  | FIG. 4A | FIG. 4B | FIG. 4C |
|---|---|---|---|
| ELECTRON GUN ACCELERATION VOLTAGE A [keV] | 20 | 19.5 | 19.5 |
| LANDING ACCELERATION VOLTAGE B [keV] | 19 | 19 | 18.5 |
| SPECIMEN CHARGE AMOUNT C [keV] | 1 | 0.5 | 1 |

ELECTRON MICROSCOPE CHARGE-UP PREVENTION METHOD AND ELECTRON MICROSCOPE

BACKGROUND OF THE INVENTION

1. Field of the Invention

This invention relates to an electron microscope charge-up prevention method and an electron microscope capable of eliminating electricity of a specimen charged-up by a specimen charge-up phenomenon occurring in a scanning electron microscope, a transmission electron microscope, etc.

2. Description of the Related Art

Nowadays, an electron microscope using an electron lens as well as an optical microscope using an optical lens and a digital microscope is used as an enlargement observation apparatus for enlarging a microbody. The electron microscope is provided by electronically optically designing an image formation system such as an optical microscope as the travel direction of electrons is refracted freely. The available electron microscopes include a transmission electron microscope, a reflection electron microscope, a scanning electron microscope, a surface emission electron microscope (field-ion microscope), and the like. The transmission electron microscope uses an electron lens to form an image of electrons passing through a specimen, a sample, etc. The reflection electron microscope forms an image of electrons reflected on the surface of a specimen. The scanning electron microscope scans a convergent electron beam over the surface of a specimen and uses secondary electrons from the scanning points to form an image. The surface emission electron microscope (field-ion microscope) forms an image of electrons emitted from a specimen by heating or ion application.

The scanning electron microscope (SEM) is an apparatus for using a secondary electron detector, a reflection electron detector, etc., to take out secondary electrons, reflection electrons, etc., occurring upon application of a thin electron beam (electron probe) to an objective specimen and displaying an image on a display screen of a CRT, LCD, etc., for the operator mainly to observe the surface form of the specimen. On the other hand, the transmission electron microscope (TEM) is an apparatus for allowing an electron beam to pass through a thin-film specimen and providing electrons scattered and diffracted by atoms in the specimen at the time as an electron diffraction pattern or a transmission electron-microscopic image, thereby enabling the operator mainly to observe the internal structure of a substance.

When an electron beam is applied to a solid specimen, it passes through the solid by energy of the electrons. At the time, an elastic collision, elastic scattering, and inelastic scattering involving an energy loss are caused by the interaction between the nucleuses and the electrons making up the specimen. As inelastic scattering occurs, the intra-shell electrons of the specimen elements and X-rays, etc., are excited, and secondary electrons are emitted, the energy corresponding thereto is lost. The emission amount of the secondary electrons varies depending on the collision angle. On the other hand, reflection electrons scattered backward by elastic scattering and emitted again from the specimen are emitted in the amount peculiar to the atom number. The scanning electron microscope uses the secondary electrons and the reflection electrons. The scanning electron microscope applies electrons to a specimen and detects the emitted secondary electrons and reflection electrons for forming an observation image.

Various factors in interfering with SEM observation exist; a representative one of factors caused by a specimen is a charge-up phenomenon occurring when a nonconductive specimen is observed. The charge-up is a phenomenon in which the application plane is charged positively or negatively because of the difference between the charges that incident charged particles and emitted charged particles have. When charge-up occurs, emitted secondary electrons are accelerated or brought back and it is made impossible to provide a good image formation characteristic; rarely, no images are formed.

When an electron beam having negative charges is incident on a bulk-like specimen, if the specimen is conductive, the charges travel through the specimen and are grounded; if the specimen is nonconductive, the charges of the incident electrons cannot escape from the surface of the specimen and the specimen itself is charged up. As a charge-up phenomenon, abnormal contrast occurs in the observation visual field or contrast appears like a belt and it becomes difficult to observe a secondary electron image. As charge-up becomes heavy, a drift of the observation visual field (the visual field slowly moves or suddenly moves rapidly) also occurs.

Thus, if the observation sample charged negatively by application of an electron beam is observed, various image faults occur. Various techniques for preventing the detrimental effects of charge-up are developed. For example, a method of applying a metal coating of gold, etc., to the surface of a nonconductive specimen is known. However, this method has disadvantages in that the metal coating is cumbersome and the specimen after observation is not restored to the former state.

Available as a technique of eliminating charges of a charged-up specimen is a method of applying an electron beam of low acceleration voltage with the generation efficiency from the specimen exceeding 1 (JP-A-7-14537). In this method, however, if the charge energy of the specimen exceeds the energy of the electron beam applied for eliminating charge, the applied electron beam is repelled and cannot arrive at the specimen and charge cannot be eliminated; this is a problem. The method also involves a problem of difficult setting of acceleration voltage. Although the acceleration voltage must be set to such acceleration voltage at which the generation efficiency of secondary electrons becomes 1, the acceleration voltage at which the generation efficiency becomes 1 varies depending on the material and shape of the specimen and thus such acceleration voltage at which the generation efficiency becomes 1 must be found out while the acceleration voltage is adjusted. If the specimen is charged up, the initial velocity of a primary electron and the beam arrival speed at the incidence time on the specimen differ and thus it becomes difficult to set the optimum acceleration voltage. Even if the acceleration voltage at which the generation efficiency becomes 1 is found out, if electrons of high acceleration voltage are applied to the specimen in the observation process conducted so far, the specimen is already charged negatively and thus an image fault caused by charge-up occurs. If applying electrons of acceleration voltage at which the generation efficiency becomes 1 is continued for a long time (for example, about several hours), charge may be able to be eliminated, but the method is not realistic.

A method of erasing charges accumulated on the surface of a specimen by applying an electron beam of acceleration voltage for generating electrons of the opposite polarity is also available (JP-A-7-14537). However, this method is a method of observing before accumulating charges is started, namely, a measure to prevent charging and is not an aggressive charge elimination method of eliminating charges.

Developed as another technique is a technique of sensing whether or not a specimen is charged up and taking measures against charging if the specimen is determined to be charged up. However, the following problems are involved in sensing charge-up: A dedicated facility to sensing charge-up becomes necessary and various phenomena of charge-up occur and thus it is difficult to correctly sense charge-up, etc. Further, the method is to prevent charge-up and is not a measure to be taken when charge-up occurs.

A method of placing the inside of a specimen chamber in atmospheric pressure and exposing a specimen to air for eliminating electricity is also available. In this method, however, electricity may be insufficiently eliminated and evacuation needs to be again performed from the beginning to again conduct observation; the method also has disadvantage in that it requires time and labor.

Further, a method of observing in a low vacuum, a method of using an electronic shower generator to apply an electronic shower, a method of using an ion shower generator to apply an ion shower (JP-A-10-12684), or a method of providing a control electrode (JP-A-5-343021) is also available. However, the methods require additional dedicated facilities and cannot easily be executed.

SUMMARY OF THE INVENTION

Thus, every method has the disadvantages and an apparatus capable of easily eliminating charge of a specimen is expected. It is therefore an object of the invention to provide an electron microscope charge-up prevention method and an electron microscope capable of simply eliminating electricity of a charged-up specimen without providing any additional dedicated facility.

In order to accomplish the object above, the following means are adopted. According to the present invention, there is provided a method for preventing an electron microscope from being charged up, the method comprising;

setting the maximum value of acceleration voltages of primary electrons applied to a specimen in the past as a start acceleration voltage for electricity elimination;
applying an electron beam to the specimen with the acceleration voltage set to the start acceleration voltage; and
gradually dropping the acceleration voltage from the start acceleration voltage to a termination acceleration voltage for electricity elimination, the termination acceleration voltage being an acceleration voltage value with which a landing acceleration voltage of the electron beam on a specimen face is placed in a range where a secondary electron emission efficiency of the specimen becomes 1 or more.

The above-mentioned electron microscope charge-up prevention method may further comprises: setting the termination acceleration voltage to an acceleration voltage value with which the landing acceleration voltage is the maximum value at which the secondary electron emission efficiency of the specimen becomes 1.

Further, the above-mentioned electron microscope charge-up prevention method may further comprises: setting the termination acceleration voltage to an acceleration voltage value with which the landing acceleration voltage is placed in an area wherein the secondary electron emission efficiency of the specimen exceeds 1.

In the above-mentioned electron microscope charge-up prevention method, while the acceleration voltage is dropped, the acceleration voltage may be applied continuously or discretely until the specimen charged negatively becomes uncharged or is charged positively.

The above-mentioned electron microscope charge-up prevention method may further comprises: comparing a plurality of specimens with respect to the maximum landing acceleration voltage; and setting the termination acceleration voltage to the lowest value of the maximum landing acceleration voltages or less.

Further, the above-mentioned electron microscope charge-up prevention method may further comprises: executing at least one simple observation image acquiring function, the simple observation image acquiring function automatically setting a plurality of simple image observation conditions with the acceleration voltage changed, acquiring a simple observation image for each acceleration voltage, and listing the simple observation images on a display; determining the maximum acceleration voltage at which the specimen is not charged up on the basis of simple observation images acquired; and setting the termination acceleration voltage to the maximum acceleration voltage at which the specimen is not charged up.

In the above-mentioned electron microscope charge-up prevention method, an area wherein the electron beam may be applied to the specimen when the charge elimination is executed may be set wider than an area when an observation is executed.

Further, in the above-mentioned electron microscope charge-up prevention method, an area wherein the electron beam may be applied to the specimen when the charge elimination is executed may be set to an area wherein a charge-up occurs or a slightly larger area than the area wherein the charge-up occurs.

In order to achieve the object of the present invention, there is also provided an electron microscope comprising:

an electron gun for applying an electron beam based on an acceleration voltage to a specimen;
an acceleration voltage application section for applying the acceleration voltage to the electron gun;
an acceleration voltage adjustment section for adjusting the acceleration voltage applied to the electron gun;
a first voltage setting section for recording the maximum value of the acceleration voltages of primary electrons applied to the specimen and setting the maximum acceleration voltage as a start acceleration voltage for an charge elimination; and
a second voltage setting section for setting an acceleration voltage value with which a landing acceleration voltage of the electron beam on a specimen face is placed in a range where a secondary electron emission efficiency of the specimen becomes 1 or more as a termination acceleration voltage for the charge elimination,
wherein when the electricity elimination is executed, the acceleration voltage adjustment section gradually drops the acceleration voltage of the electron beam applied to the specimen from the start acceleration voltage to the termination acceleration voltage.

In the above-mentioned electron microscope, the termination acceleration voltage may be set to an acceleration voltage value with which the beam arrival acceleration voltage is the maximum value at which the secondary electron emission efficiency of the specimen becomes 1.

Further, in the above-mentioned electron microscope, the termination acceleration voltage may be set to an acceleration voltage value with which the landing acceleration voltage is placed in an area wherein the secondary electron emission efficiency of the specimen exceeds 1.

In the invention, the electron gun for observation is used to eliminate electricity of the charged-up specimen, so that additional special apparatus of charge-up sensing and electricity elimination facilities, etc., need not be provided and the cost can be reduced. The acceleration voltage for applying primary electrons to a specimen is lowered gradually from the acceleration voltage at which the primary electrons are not repelled by the electrons charged on the specimen to the acceleration voltage for removing the electrons charged on the specimen, whereby charge is eliminated. Thus, electricity of even a specimen in such a strong charge state repelling an electron beam in the method in the related art can be eliminated, and electricity elimination can be conducted effectively for various charge-up phenomena. The need for releasing or changing the vacuum state as in the method in the related art is also eliminated and electricity elimination can also be executed easily in a short time with the vacuum state maintained.

BRIEF DESCRIPTION OF THE DRAWINGS

FIG. 5 is a table to show.the charge amounts in parts in FIGS. 4A to 4C;

DETAILED DESCRIPTION OF THE INVENTION

Figure 1:
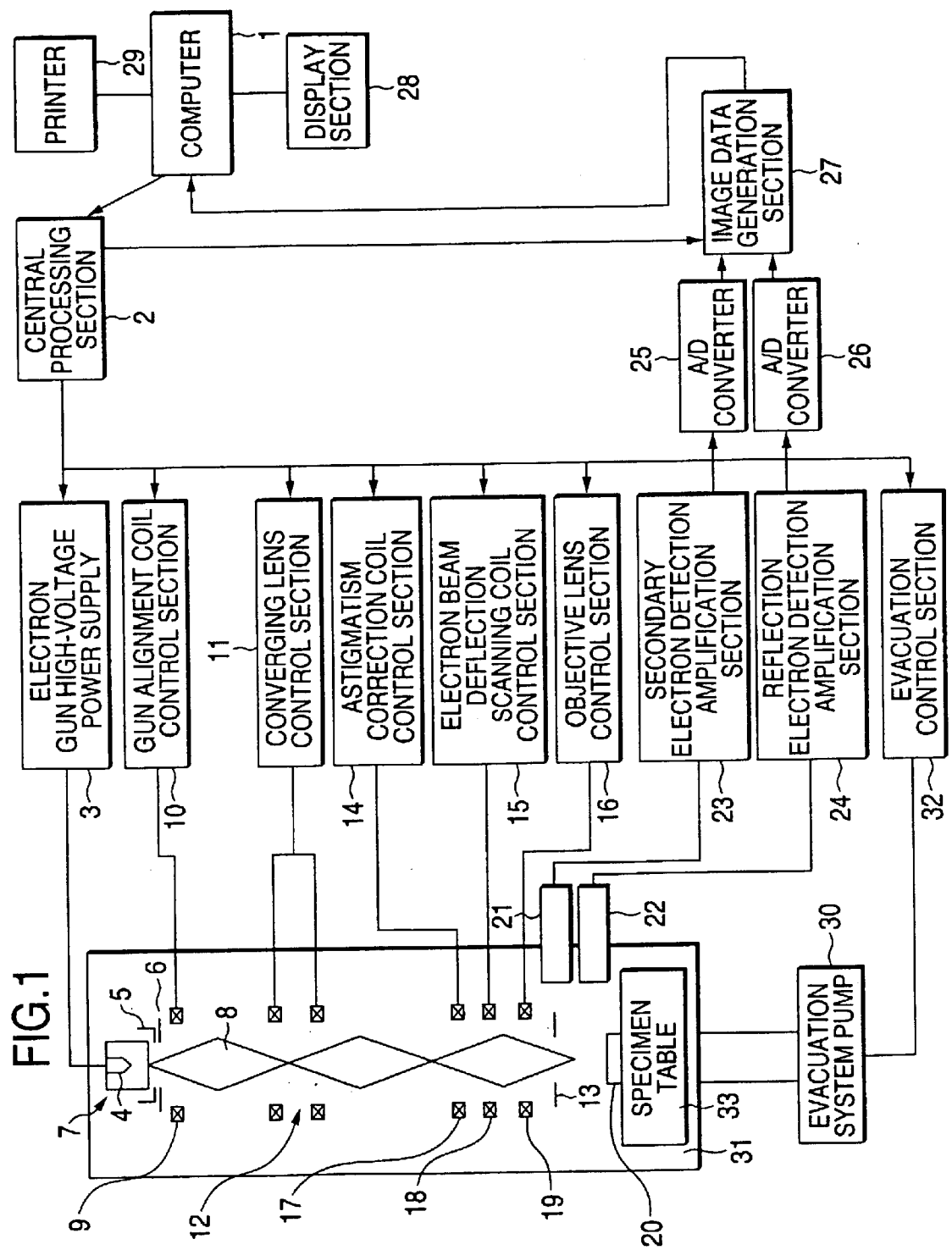
FIG. 1 is a block diagram to show the configuration of a scanning electron microscope according to one embodiment of the invention.

Referring now to the accompanying drawings, there is shown a preferred embodiment of the invention. However, it is to be understood that the following embodiment is illustrative for an electron microscope charge-up prevention method and an electron microscope capable of eliminating electricity of a charged-up specimen to embody the technical philosophy of the invention and that the invention does not limit the an electron microscope charge-up prevention method and the electron microscope capable of eliminating electricity of a charged-up specimen to the following.

It is also to be understood that the specification does not limit the members defined in the appended claims to the members in the embodiment. The sizes of members shown in the accompanying drawings, their positional relationship, and the like may be exaggerated to clarify the description.

In the specification, an electron microscope, a computer connected thereto for operation, control, display, other processing etc., and other peripheral machines of a printer, etc., are electrically connected, for example, as serial connection or parallel connection of IEEE1394, RS-232C, RS-422, USB, etc., or through a network of 10BASE-T, 100BASE-TX, etc., for conducting communications. The connection is not limited to physical connection using wires and may be wireless connection using radio waves, infrared rays, optical communications, etc., such as wireless LAN, Bluetooth, etc. Further, a memory card, a magnetic disk, an optical disk, a magneto-optical disk, semiconductor memory, etc., can be used as a record medium for storing data of observation images, etc.

In the following embodiment, a SEM will be discussed. However, the invention can also be used with a TEM or any other electron microscope relevant apparatus. The SEM according to one embodiment of the invention will be discussed with reference to FIG. 1. The SEM generally is made up of an optical system for generating an electron beam of acceleration electrons and making the electron beam arrive at a specimen, a specimen chamber in which a specimen is placed, an evacuation system for evacuating the specimen chamber, and an operation system for observing an image. FIG. 2 is an image drawing of a user interface screen of an operation program of the electron microscope. The electron microscope operation program is installed in the computer 1 in FIG. 1 for setting image observation conditions of the electron microscope and performing various types of operation and displays the user interface screen including a display section for displaying observation images shown in FIG. 2 on the display section 28 in FIG. 1.

The optical system comprises an electron gun 7 for generating an electron beam of acceleration electrons, a lens system for narrowing down a bundle of acceleration electrons to a narrower bundle, and detectors for detecting secondary electrons and reflection electrons generated from a specimen. The scanning electron microscope shown in FIG. 1 has the optical system comprising an electron gun 7, a gun alignment coil 9, condenser lenses of converging lenses 12, an electron beam deflection scanning coil 18, a secondary electron detector 21, and a reflection electron detector 22. The electron gun 7 applies an electron beam. The gun alignment coil 9 makes a correction to the electron beam applied from the electron gun 7 so that the electron beam passes through the center of a lens system. The condenser lenses of converging lenses 12 narrows down the size of the spot of the electron beam. The electron beam deflection scanning coil 18 scans the electron beam converged through the converging lenses 12 over a specimen 20. The secondary electron detector 21 detects secondary electrons emitted from the specimen 20 with scanning. The reflection electron detector 22 detects reflection electrons.

The specimen chamber comprises a specimen table, a specimen introduction unit, an X-ray detection spectroscope, etc. The specimen table comprises X, Y, Z move, rotation, and tilt functions.

The evacuation system is required for the electron beam of acceleration electrons to arrive at the specimen without losing energy as much as possible while the electron beam passes through the gas component; it mainly uses a rotary pump, an oil diffusion pump.

The operation system adjusts, focuses, etc., an application current while displaying a secondary electron image, a reflection electron image, an X-ray image, etc., for observation. Output of a secondary electron image, etc., is typically film photographing with a camera if the signal is analog; in recent years, however, it has been made possible to convert an image into a digital signal for output, and various types of processing such as data storage, image processing, and print are possible. The SEM in FIG. 1 comprises a display section 28 for displaying an observation image of a secondary electron image, a reflection electron image, etc., and a printer 29 for printing the image. The operation system comprises guide means for guiding the operator through a setting procedure of a setup item required for setting at least acceleration voltage or spot size as an image observation condition.

Figure 2:
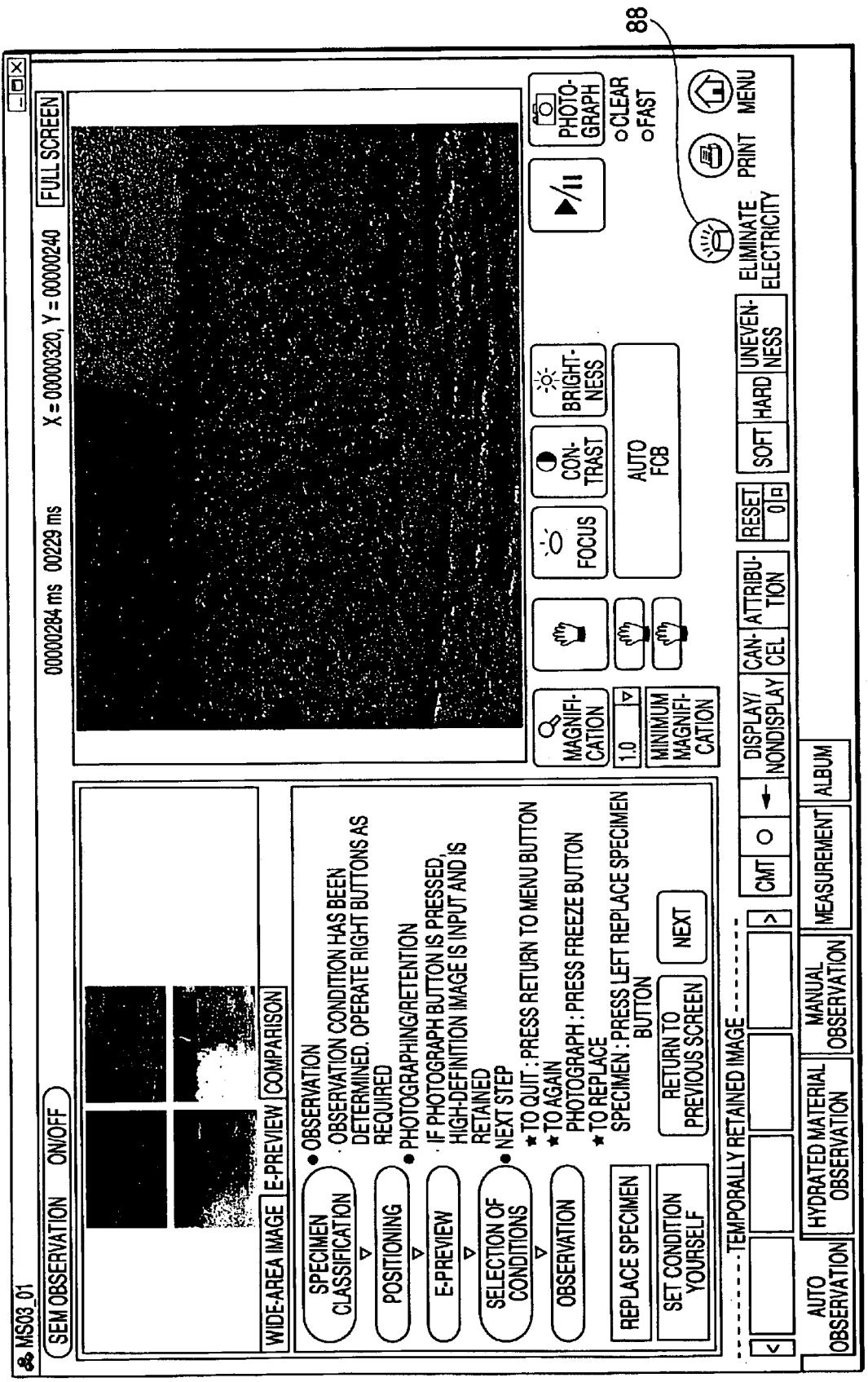
FIG. 2 is an image drawing to show an example of a user interface screen of a scanning electron microscope operation program.

The SEM shown in FIG. 1 is connected to a computer 1 for use as a console for operating the electron microscope; the computer 1 also stores image observation conditions and image data and performs image processing and operations as required. A central processing section 2 made up of a CPU, LSI, etc., shown in FIG. 1 controls the blocks making up the electron microscope. An electron gun high-voltage power supply 3 is controlled, whereby an electron beam is generated from the electron gun 7 consisting of a filament 4, Wehnelt 5, and an anode 6. An electron beam 8 generated from the electron gun 7 does not necessarily pass through the center of the lens system and a gun alignment coil control section 10 controls the gun alignment coil 9 for making a correction to the electron beam so that the electron beam passes through the center of the lens system. Next, the electron beam 8 is narrowed down through the condenser lenses of the converging lenses 12 controlled by a converging lens control section 11. The converged electron beam 8 passes through an astigmatism correction coil 17 for deflecting the electron beam 8, the electron beam deflection scanning coil 18, an objective lens 19, and objective lens stop 13 for determining the beam aperture angle of the electron beam 8, and arrives at the specimen 20. The astigmatism correction coil 17 is controlled by an astigmatism correction coil control section 14, and controls scanning speed, etc. Likewise, the electron beam deflection scanning coil 18 is controlled by the electron beam deflection scanning coil control section 15, and the objective lens 19 is controlled by an objective lens control section 16, whereby the electron beam 8 scans over the specimen 20. As the electron beam 8 scans over the specimen 20, information signals of secondary electrons, reflection electrons, etc., are generated from the specimen 20, and are detected by the secondary electron detector 21 and the reflection electron detector 22. The detected secondary electron information signal and the detected reflection electron information signal are passed through a secondary electron detection amplification section 23 and a reflection electron detection amplification section 24 and are converted into digital signals by A/D converters 25 and 26 respectively. The digital signals are sent to an image data generation section 27 for providing image data. The image data is sent to the computer 1 and is displayed on the display section 28 such as a monitor connected to the computer 1 and is printed on the printer 29 as required.

An evacuation system pump 30 evacuates a specimen chamber 31. An evacuation control section 32 connected to the evacuation system pump 30 adjusts the vacuum degree for controlling the vacuum degree from high vacuum to low vacuum in response to the specimen 20 and the observation purpose.

The electron gun 7 is a section as a source for generating an acceleration electron having one energy; in addition to a heat electron gun for heating a W (tungsten) filament or an $LaB_6$ filament to emit electrons, a field emission electron gun for applying a strong electric field to the tip of W formed like a point for emitting electrons is available. Converting lens, objective lens, objective lens stop, electron beam deflection scanning coil, astigmatism correction coil, and the like are placed in the lens system. The converging lens further converges the electron beam generated by the electron gun and thins down the electron beam. The objective lens is a lens for finally focusing an electron probe on a specimen. The objective lens stop is used to lessen aberration. The detectors are a secondary electron detector for detecting secondary electrons and a reflection electron detector for detecting reflection electrons. The secondary electron has low energy and thus is captured by a collector and is converted into a photoelectron by a scintillator and the signal is amplified by a photomultiplier tube. On the other hand, to detect a reflection electron, a scintillator or a semiconductor type is used.

Specimen Table

To position the observation position, a specimen table 33 on which a specimen 20 is placed is moved physically. In this case, observation positioning means is implemented as the specimen table 33. The specimen table 33 can be moved and adjusted in various directions so that the observation position of the specimen 20 can be adjusted. To move and adjust the observation position of the specimen table, the specimen table can be moved and finely adjusted in an X axis direction, a Y axis direction, and an R axis direction of the specimen table. In addition, to adjust the tilt angle of the specimen, the specimen table can be adjusted in a T axis direction of the specimen table and to adjust the distance between the objective lens and the specimen (working distance), the specimen table can be adjusted in a Z axis direction of the specimen table.

To position an observation image and move the observation visual field, the method is not limited to the method of physically moving the specimen table; for example, a method of shifting the scan position of an electron beam applied from the electron gun (image shift) can also be used. Alternatively, both methods can also be used in combination or a method of once inputting image data in a wide range and then processing the data by software can also be used. In this method, the data is once input and is processed and thus the observation position can be moved by software and the method has the advantage that it does not involve hardware move of moving the specimen table or scanning an electron beam. To previously input large image data, for example, a method of acquiring a plurality of pieces of image data at various positions and concatenating the image data, thereby acquiring wide-area image data is available. Alternatively, image data is acquired at low magnification, whereby the acquired area can be taken large.

Emission Efficiency Characteristic of Secondary Electrons

Figure 3:
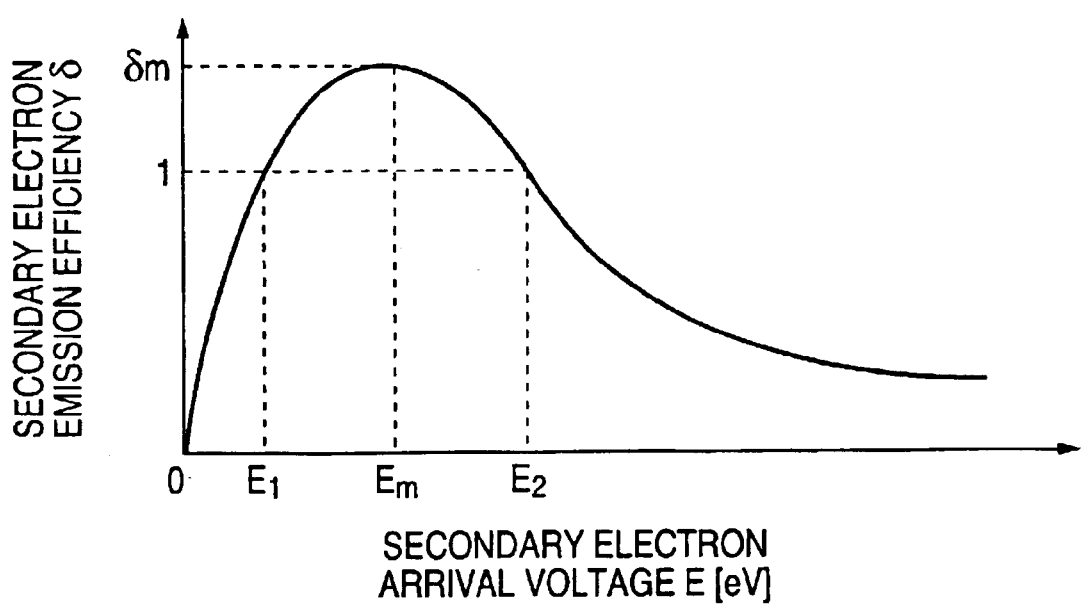
FIG. 3 is a graph to show the emission efficiency of secondary electrons relative to beam arrival acceleration voltage when a primary electron emitted from an electron gun arrives at a specimen.

When an electron beam is incident on a specimen, secondary electrons, reflection electrons, etc., are emitted from the specimen. The amount of the secondary electrons emitted by the specimen depends on the material of the specimen and the acceleration voltage. FIG. 3 shows the emission efficiency of secondary electrons relative to beam arrival acceleration voltage (landing energy) when a primary electron emitted from the electron gun by application of acceleration voltage arrives at the specimen. As shown in the figure, when the landing acceleration voltage is $E_1$ or $E_2$, secondary electron emission efficiency δ becomes 1. Here, assuming that $E_1<E_2$, $E_2$ is called maximum beam arrival acceleration voltage. While the beam arrival acceleration voltage is from $E_1$ to $E_2$, the secondary electron emission efficiency δ becomes 1 or more; when the voltage is $E_m$, maximum value $δ_m$ is reached. Therefore, meanwhile, if one primary electron is made incident on the specimen, one or more secondary electrons are emitted. Consequently, if the specimen is an insulator, it is charged positively as the electron amount is decreased. If the specimen is charged positively, the positive charges attract the primary electrons and thus the electrons are more accelerated.

On the other hand, when the beam arrival acceleration voltage is in the range of 0 to $E_1$ or $E_2$ or more, the secondary electron emission efficiency δ becomes 1 or less. This means that if one primary electron is made incident, the number of secondary electrons emitted from the specimen becomes one or less. Consequently, electrons not emitted accumulate in the specimen and the specimen is negatively charged accordingly. If the specimen is charged negatively, the primary electrons are decelerated by the negative charges. If the secondary electron emission efficiency δ is close to 1, the charges are balanced and the charge amount does not change.

Since the charged specimen is surrounded by vacuum, the charges are not emitted and remain in the specimen, causing a charged phenomenon called charge-up to occur. Image faults caused by charge-up include abnormal contrast of an observation image, time-sequence change in the brightness of an observation image, a move of an observation image, an instantaneous move of an observation image, a time-sequence shift of focal distance, primary electrons not arriving at a specimen, etc. It is difficult to automatically detect such charge-up phenomena by a detector, etc. On the other hand, if charge-up occurs, no problem occurs if an anomaly does not occur in the observation image.

In the embodiment of the invention, an electron beam is applied to a charged-up specimen while the acceleration voltage is lowered gradually. As for the acceleration voltage, the beam arrival acceleration voltage on the specimen surface is set so that the secondary electron emission efficiency becomes 1 or more and electrons are emitted from the specimen. Accordingly, electrons are decreased from the specimen charged negatively, and the beam arrival acceleration voltage approaches the maximum beam arrival acceleration voltage $E_2$.

Figure 4A:
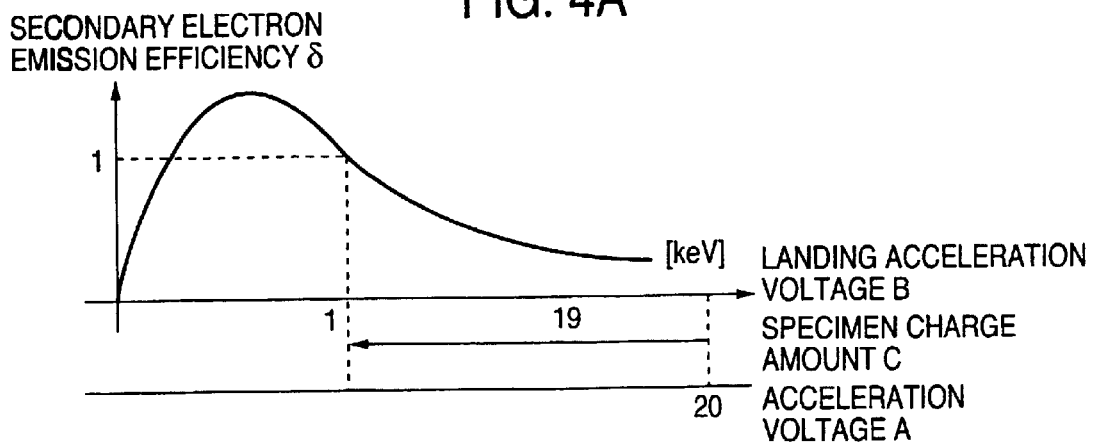
FIGS. 4A to 4C are drawings to show how the landing acceleration voltage changes in an charge elimination process.

This situation will be discussed with reference to FIGS. 3 to 5. FIGS. 4A to 4C show how the beam arrival acceleration voltage changes in an electricity elimination process, and FIG. 5 shows the charge amounts. In FIG. 4A, with the specimen charged to 19 keV, the electron gun acceleration voltage is set to 20 keV and a primary electron is applied to the specimen. At this time, as the specimen is charged to 19 keV, repulsion acts and the primary electron is decelerated and is made incident on the specimen at beam arrival acceleration voltage of 20−19=1 keV. Now, assuming that the maximum beam arrival acceleration voltage $E_2$ at which the secondary electron emission efficiency δ becomes 1 in FIG. 3 is 1 keV, the secondary electron emission efficiency δ becomes 1 and the electron incidence and emission amounts become equal and thus the charge amount of the specimen does not change as 19 keV.

Figure 4B:
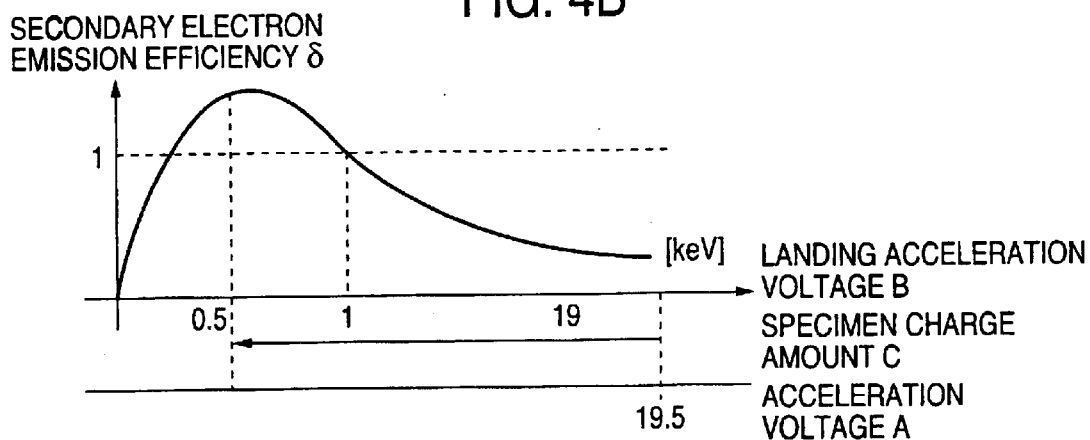
Figure 4C:
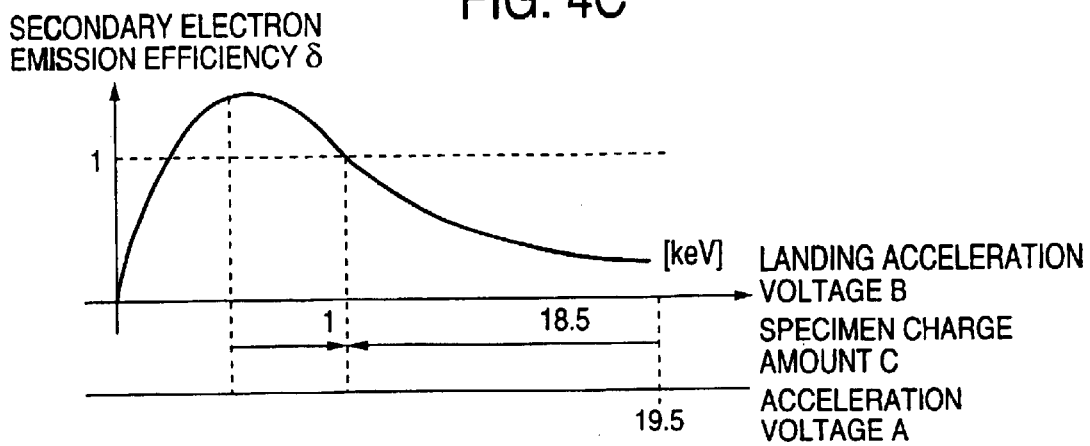

Next, as in FIG. 4B, the electron gun acceleration voltage is lowered 0.5 keV to 19.5 keV. At this time, the beam arrival acceleration voltage on the specimen surface becomes 19.5−19=0.5 keV and thus the secondary electron emission efficiency δ becomes 1 or more and the amount of electrons emitted from the specimen is increased. Consequently, the charges of the specimen are decreased and as the charges are decreased, the charge amount on the specimen surface rises and thus the electron emission amount is also decreased. As shown in FIG. 4C, when the beam arrival acceleration voltage becomes the maximum landing acceleration voltage $E_2$ (1 keV), balance is achieved. Accordingly, the charge amount as the landing acceleration voltage rises is emitted from the specimen and consequently the charge amount is decreased 0.5 keV.

Figure 6A:
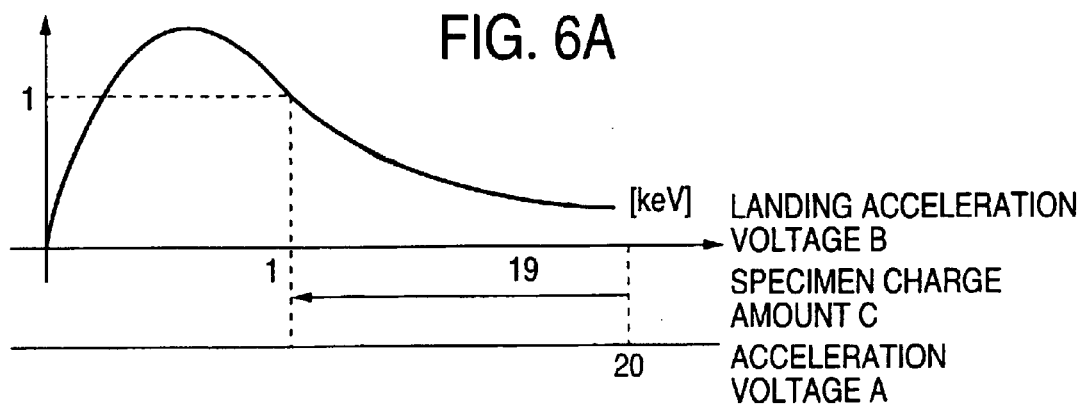
FIGS. 6A to 6D are drawings to show a situation in which acceleration voltage is dropped from electricity elimination start voltage 20 keV to charge elimination termination voltage 0.5 keV.
Figure 6B:
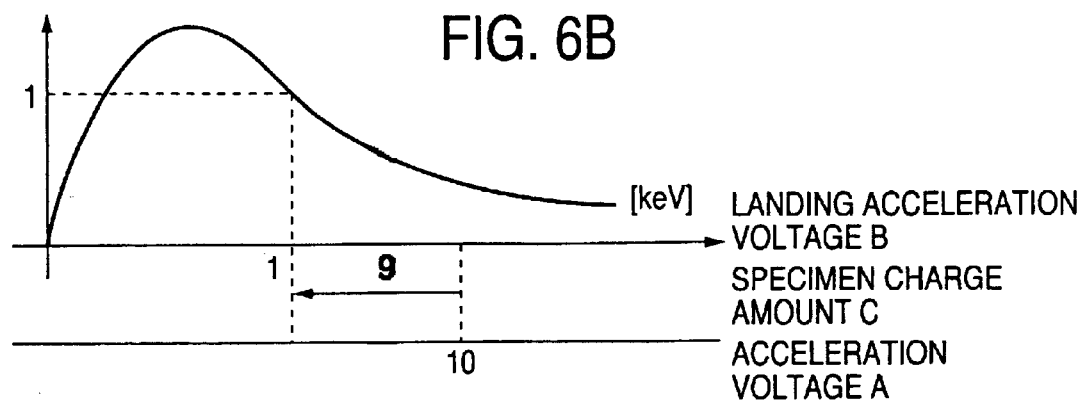
Figure 6C:
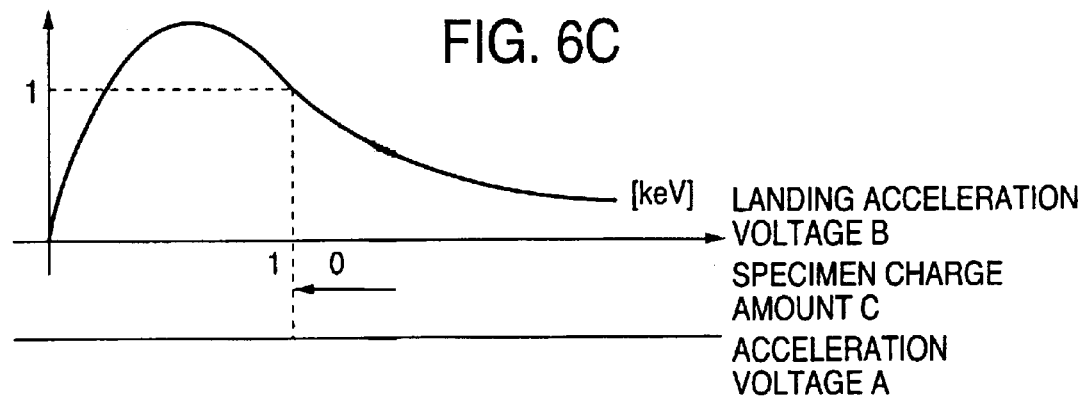
Figure 6D:
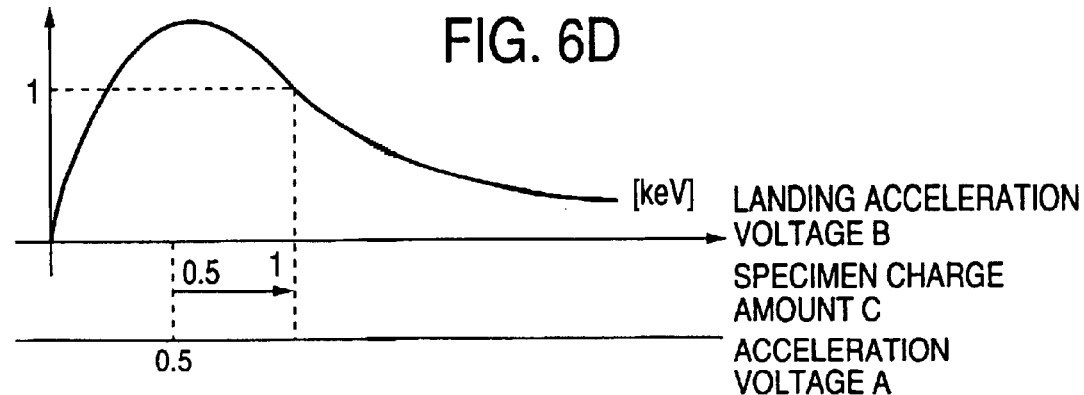

After this, further the electron gun acceleration voltage is lowered gradually and the above-described process is repeated, whereby the charges of the specimen are emitted. FIGS. 6A to 6D show a situation in which the acceleration voltage is dropped from charge elimination start voltage 20 keV to charge elimination termination voltage 0.5 keV. FIG. 6A shows a state in which the charge amount on the specimen surface is 19 keV and acceleration voltage 20 keV is applied. The beam arrival acceleration voltage approaches the maximum landing acceleration voltage $E_2$ (1 keV) at which the secondary electron emission efficiency δ becomes 1, and balance is achieved. As the acceleration voltage is dropped gradually, the charge amount is decreased so that the landing acceleration voltage becomes 1 keV. FIG. 6B shows a state in which the acceleration voltage is 10 keV and the charge amount is 9 keV, and FIG. 6C shows a state in which the acceleration voltage is 1 keV and the charge amount is 0 keV. In this state, electricity elimination is accomplished completely and may be terminated. However, electricity elimination may be conducted until the charge amount is 0 keV or the specimen is charged a little positively, because it is desirable that the specimen should be charged positively rather than negatively; in fact, it is not easy to set the charge amount completely to zero and thus the specimen is a little positively charged intentionally for safety. In FIG. 6D, the acceleration voltage is 0.5 keV and the specimen is charged positively in the charge amount 0.5 keV. In this state, charge elimination is terminated. If the specimen is charged positively in the charge amount 0.5 keV or so, the actual observation operation is not hindered.

According to the described method, the acceleration voltage is dropped from the electricity elimination start voltage to the charge elimination termination voltage, and charge of the charged-up specimen is eliminated. The primary electron acceleration voltage applied for electricity elimination is determined as follows:

Electricity Elimination Start Voltage

The electricity elimination start voltage for starting electricity elimination is set to the maximum value of the acceleration voltage applied to specimen in the past, because the specimen is charged by application of acceleration voltage of the electron gun and thus cannot be charged at the maximum value of the acceleration voltage or more. When the specimen is charged up, if the acceleration voltage applied to the electron gun is too weak, a situation in which primary electron is repelled by the charges of the specimen and cannot arrive at the specimen occurs. Thus, the acceleration voltage needs to be raised, but if the acceleration voltage is too raised, a problem of charging up the specimen occurs. Therefore, appropriate acceleration voltage needs to be set. If the primary electron is accelerated according to the maximum value of the acceleration voltage applied in the past, the primary electron is not repelled by the charges of the specimen. To obtain the maximum value of the acceleration voltage, a history of the acceleration voltage values from starting of specimen observation is recorded. The history is recorded automatically in the electron microscope or the computer connected to the electron microscope. When charge elimination is performed, the history is searched for the maximum acceleration voltage at the point in time. Alternatively, memory in which the acceleration voltage value is updated to a higher acceleration voltage value if the higher value is encountered may be used.

Electricity Elimination Termination Voltage

The electricity elimination termination voltage for terminating charge elimination is set to the maximum landing acceleration voltage or less. When the voltage is the maximum beam arrival acceleration voltage, the secondary electron emission efficiency becomes 1 and the charge amount becomes 0, but the charge elimination termination voltage is set to a slightly lower value than the maximum landing acceleration voltage so that the specimen is charged a little positively for safety. Since the characteristic of the secondary electron emission efficiency varies from one specimen to another, a plurality of specimens are previously compared with respect to the secondary electron emission efficiency, the lowest value of the maximum beam arrival acceleration voltage is extracted, and a slightly lower value than the extracted value is set, whereby charge of any specimen can be eliminated. The setting is previously built in the electron microscope and the value is set automatically without the operator being aware of it. The operator can also specify any desired charge elimination termination voltage.

Alternatively, if the acceleration voltage at which charge-up does not occur is found, the value of the acceleration voltage can also be adopted as the charge elimination termination voltage. For example, a simple observation image acquiring function of simply acquiring an observation image and displaying the observation image is executed and the maximum acceleration voltage at which charge-up does not occur is measured about each specimen to be observed. The electron microscope comprises e-preview as the simple observation image acquiring function. The e-preview is as follows: To provide an optimum observation condition, a plurality of recommended observation conditions are simply prepared in the electron microscope or the computer, and observation images are acquired under the observation conditions and are listed on display as simple observation images. First, a plurality of sets of settings with one or more of setup items of SEM image observation condition changed are provided as simple image observation condition. For example, a plurality of simple image observation conditions with the acceleration voltage or the detector type changed are generated automatically. The provided simple image observation conditions are set in the SEM in order and the specimen is observed consecutively under the conditions. The observed simple observation images are temporarily retained and are listed on a second display section. When the simple observation images are listed, they can be displayed simultaneously on a reduced scale. The operator compares the displayed simple observation images with each other and checks to see if charge-up occurs. If an image fault caused by charge-up is detected on the screen of the simple observation images, the acceleration voltage used with the immediately preceding observation image becomes the maximum acceleration voltage at which charge-up does not occur. The e-preview is executed more than once as required. For example, if charge-up is not detected, the acceleration voltage is raised and again e-preview is executed. Alternatively, to examine in detail the maximum acceleration voltage at which charge-up does not occur, the change amount of the acceleration voltage used in e-preview can also be lessened for narrowing down. The maximum acceleration voltage thus measured at which charge-up does not occur is set as the charge elimination termination voltage. The operator selects the corresponding simple observation image out of the second display section, whereby automatically the electron microscope or the computer retains and sets the corresponding acceleration voltage as the maximum acceleration voltage at which charge-up does not occur. The operator may manually record or enter the maximum acceleration voltage at which charge-up does not occur.

The change amount to drop the acceleration voltage from the charge elimination start voltage to the charge elimination termination voltage may be continuous or discrete. However, if the change amount is made too large, it is feared that the area $E_1$ to $E_2$ in which the secondary electron emission efficiency δ is 1 or more may be exceeded and charges may be unable to be emitted. Thus, a smaller value than $|E_2-E_1|$ is set. For example, the acceleration voltage is dropped gradually with the change amount set to a value of 1 keV or less, preferably several ten eV to several hundred eV. Accordingly, the following nature can be used: If the beam arrival acceleration voltage is in the proximity of the maximum landing acceleration voltage $E_2$, it approaches $E_2$ and balance is achieved.

Alternatively, the pattern of secondary electron emission efficiency δ is previously stored for each material in response to the material forming each specimen or a reference table is provided and when the operator specifies or the electron microscope detects the type of specimen, the corresponding secondary electron emission efficiency is found and the charge elimination termination voltage, etc., can also be set in response thereto.

According to the described method, charge elimination can be easily executed in a short time. For example, assuming that the charge elimination start voltage is 20 keV and the charge elimination termination voltage is 0.5 keV, electricity elimination work is completed in about 30 seconds to one minute. In the method, the need for releasing the vacuum state as in the related art is eliminated, so that charge elimination can be reliably executed easily and in a short time.

Application Area

The area wherein an electron beam is applied to a specimen when charge elimination is executed can be adjusted as required for executing charge elimination more efficiently. For example, the area wherein an electron beam is applied to a specimen when electricity elimination is executed is set to the same area as the area wherein charge-up occurs or a slightly larger area. An electron beam for charge elimination is applied only to the area wherein charge-up occurs in the observation image or a slightly wider area considering an allowance, whereby the electron beam is not applied to a fruitless area not requiring charge elimination and the applied electron beam density is increased in the necessary area, so that charge elimination is executed effectively and the charge elimination time can be shortened. For example, the magnification at the charge elimination time is set higher than that at the observation time, the charge-up area is displayed on an enlarged scale, and the electron beam for charge elimination is applied only to the charge-up area and its surroundings.

On the other hand, if charge elimination is applied only to the charge-up area, charges may be left in the surroundings of the charge-up area, causing an image fault to occur. In such a case, to apply an electron beam to a wider range, the magnification of the electron microscope is set to a low value. The area wherein the electron beam for charge elimination is applied to specimen is widened, whereby charge elimination is executed reliably and the state in which charges are left in the surroundings of the observation area, causing an image fault to occur can be circumvented.

The electron beam scanning speed can also be adjusted as required. If the average application amount of electron beams is the same, scanning over a charge-up area is slowed down and scanning over a non-charge-up area is speeded up, so that the electron beam can be used efficiently.

Alternatively, the spot size of the applied electron beam is adjusted. As the spot size is enlarged, the scanning time is shortened and the electron beam is much applied accordingly.

Further, the emission current of the electron gun for emitting primary electrons can also be changed. As the current flowing into the filament of the electron gun is increased, the emitted electron amount is increased.

Further, when the acceleration voltage is dropped, the gun alignment of the electron gun can also be again adjusted. If the acceleration voltage is changed, an axis shift occurs and electrons are not applied to the target position. Thus, while the gun alignment is again adjusted, an electron beam is applied. Likewise, the focal distance of the applied electron beam and a visual field shift can also be again adjusted. The items are again adjusted in response to change in the acceleration voltage, whereby the electron beam can be applied to the specimen more precisely for conducting charge elimination efficiently.

Image Observation using Electricity Elimination Function

Figure 7:
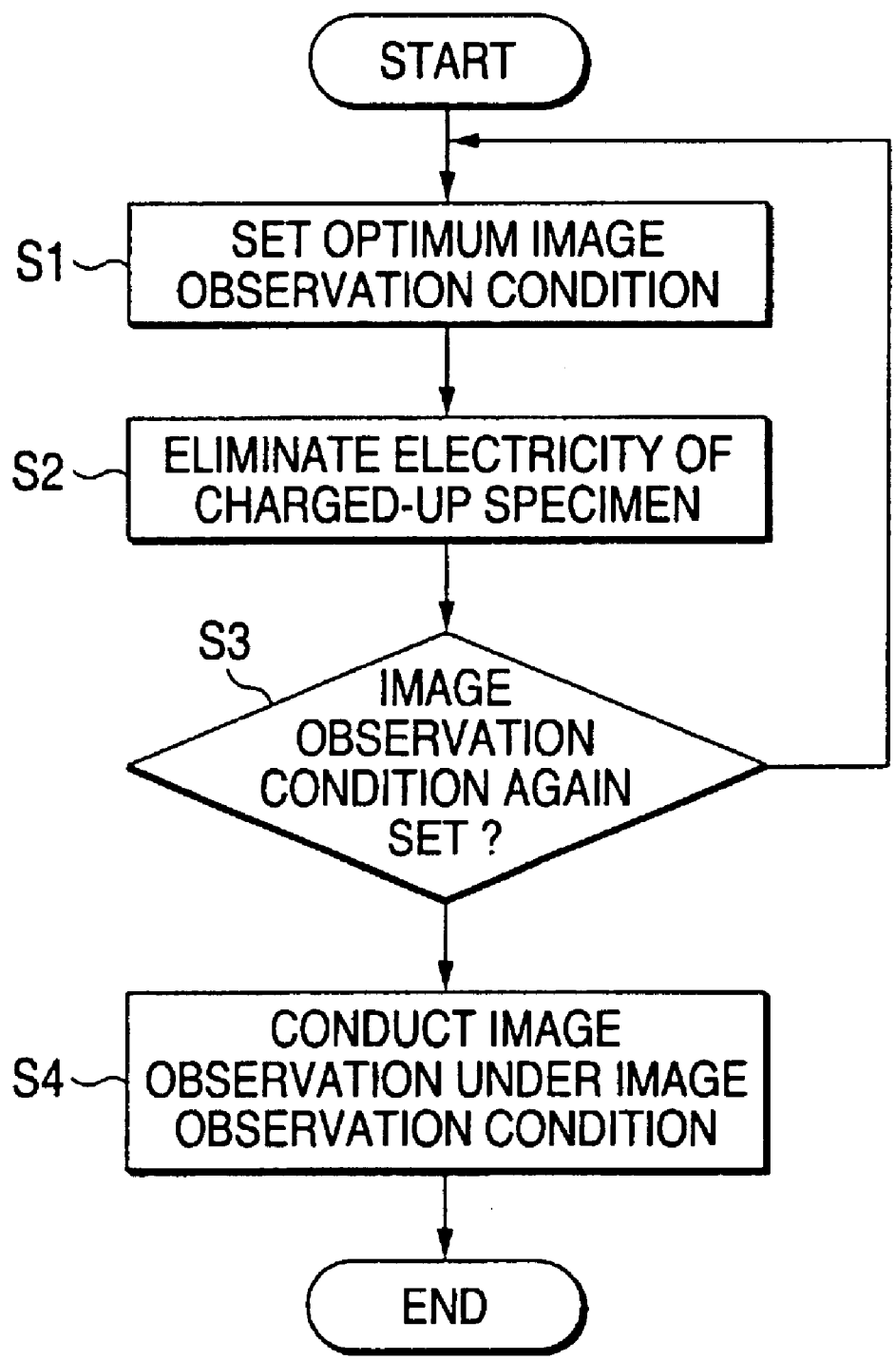
FIG. 7 is a flowchart to describe a flow of charge elimination operation.

An example of conducting image observation of a specimen using an charge elimination function will be discussed with reference to a flowchart of FIG. 7.

At step S1, an optimum image observation condition is set. Here, e-preview is executed and a search is made for the image observation condition fitted for the specimen and the observation purpose. The image observation condition includes the acceleration voltage, the spot size, selection of either secondary electron detector or reflection electron detector as a detector, the vacuum degree in the specimen chamber 31, the magnification, the specimen observation position, namely, the X, Y, R axis position of the specimen table, the specimen tilt angle, namely, the T axis position of the specimen table, the working distance, namely, the Z axis position of the specimen table, the objective lens stop diameter, and the like.

The acceleration voltage is one of the most important parameters. As e-preview is executed, a plurality of simple image observation conditions with the acceleration voltage changed are set, a simple observation image is acquired about each acceleration voltage, and the acquired simple observation images are listed on the second display section. An optimum simple observation image is selected out of the second display section so as to set to the highest acceleration voltage at which an image fault does not occur. However, the specimen charge amount also changes depending on any other parameter of the spot size, the magnification, the vacuum degree, etc. For example, if the magnification is raised and some area is displayed on an enlarged scale, charge-up easily occurs. As for the vacuum degree, if air in the specimen chamber 31 is much, air is ionized and charge-up is hard to occur. Thus, each parameter affects charge-up and to determine the optimum value, the simple image observation condition may be changed with respect to the parameters.

In e-preview, observation is conducted in order starting at the condition hard to receive the effect of charge-up. For example, in e-preview for changing the acceleration voltage, simple image observation is conducted in the ascending order of the acceleration voltages. In e-preview, simpler setting than the usual image observation condition is applied. Predetermined values are applied to the acceleration voltage, the spot size, the detector type, the magnification, the position, etc., of the set up parameters, and focus, astigmatism correction, brightness, contrast, gun alignment adjustments, etc., to the acquired image are made automatically. Therefore, automatically a plurality of simple observation images are acquired and are displayed on the second display section without the operator setting each parameter separately. However, the operator may specify a simple image observation condition separately. The operator compares the simple observation images thus provided with each other and selects any desired image. The simple image observation condition corresponding to the selected simple observation image is set as the image observation condition.

Next, at step S2, charge of the charged-up specimen is eliminated. At step S1, when e-preview is executed, an electron beam is applied to and is scanned over the specimen more than once for simple image picking up. Thus, if e-preview is executed, the specimen is easily charged up. If normal image picking up is performed in the state, an image fault is caused by charge-up and thus charge elimination needs to be conducted. Then, charge elimination is conducted according to the above-described procedure. For example, if five simple observation images are acquired by application of acceleration voltages 0.5 keV, 0.7 keV, 1.0 keV, 1.2 keV, and 1.5 keV in e-preview, the highest acceleration voltage is 1.5 keV and thus the charge elimination start voltage is set to 1.5 keV. The charge elimination termination voltage is set to the lowest acceleration voltage 0.5 keV. Accordingly, the charges of the specimen are eliminated reliably.

The charge elimination work is started automatically. For example, whenever e-preview terminates, automatically the charge elimination work is performed. However, the operator can also press an ELIMINATE CHARGE button 88 on the screen in FIG. 2 to manually execute the charge elimination work. For example, for the operator to set each item of image observation condition from the manual observation mode independently of e-preview in FIG. 2, if the operator presses the ELIMINATE CHARGE button 88 to perform charge elimination when charge-up occurs, etc., a transition is made to the charge elimination work. A message of DURING CHARGE ELIMINATION, etc., is displayed on the operation panel, informing the operator that charge elimination work is being executed.

At step S3, whether or not any desired image observation condition is acquired is determined. Further, to again set an image observation condition, return is made to step S1 and image observation condition setting is repeated. For example, if the desired image observation condition is not acquired or if the condition is narrowed to acquire more detailed image observation condition, first the parameter change amount of the simple image observation condition is made large and rough image observation condition is examined and then the change amount is lessened and a search is made for the detailed image observation condition. Thus, e-preview is repeated as required and if any desired image observation condition is acquired, a transition is made to step S4 and image observation is conducted under the image observation condition, and any desired processing is performed for the acquired observation image.

According to the method, charge-up can be removed reliably and an observation image free of image fault can be acquired. Since various phenomena of charge-up exist, it is difficult to automatically detect charge-up precisely and if charge-up occurs, there is no problem unless image fault occurs. Thus, observation image needs to be actually displayed for determination. In the related art, whether or not one image observation condition is a condition under which charge-up occurs can be determined, but the image observation condition preceding the condition under which charge-up is about to occur, for example, the highest acceleration voltage at which charge-up does not occur cannot be detected. Therefore, to search for an image observation condition under which charge-up does not occur, it is necessary to repeat examination of observation image and charge elimination while changing the image observation condition. Then, if the embodiment of the invention is used, charge elimination can be executed reliably without special facilities and image observation can be conducted correctly. To change the simple image observation condition to search for the optimum image observation condition, as charge elimination is executed, the preceding image observation effect can also be removed and new image observation can be repeated. Since the steps are automatically executed, if the operator does not have knowledge about charge-up, charge elimination is executed for every charge-up phenomenon and observation under the optimum image observation condition is made possible. The charge elimination start voltage is set to the maximum acceleration voltage used so far, whereby a situation in which the electron beam applied for eliminating charge is repelled and charge cannot be eliminated can be circumvented. Thus, charge elimination can be conducted regardless of the charge amount of the specimen or the material of the specimen.

As described above, according to the electron microscope charge-up prevention method and the electron microscope of the invention, the extremely excellent advantage that charge elimination can be executed easily in an already existing system is provided, because the electron microscope charge-up prevention method and the electron microscope of the invention use the same electron gun as used in observation to apply primary electrons to a specimen, thereby eliminating charge. The existing facility of the electron gun contained in the electron microscope is used to eliminate charge effectively, so that a dedicated facility need not be provided and no additional facility cost is incurred. Moreover, charge elimination is conducted automatically or can be executed simply as the operator presses the ELIMINATE CHARGE button, so that special knowledge and work are not required and charge can be eliminated in a far easy manner and moreover in a short time and effectively as compared with the method of exposing a specimen to air for eliminating charge, etc.

What is claimed is:

1. A method for preventing an electron microscope from being charged up, the method comprising;
    setting the maximum value of acceleration voltages of primary electrons applied to a specimen in the past as a start acceleration voltage for charge elimination;
    applying an electron beam to the specimen with the acceleration voltage set to the start acceleration voltage; and
    gradually dropping the acceleration voltage from the start acceleration voltage to a termination acceleration voltage for charge elimination, the termination acceleration voltage being an acceleration voltage value with which an arrival acceleration voltage of the electron beam on a specimen face is placed in a range where a secondary electron emission efficiency of the specimen becomes 1 or more.

2. The method as claimed in claim 1, further comprising:
    setting the termination acceleration voltage to an acceleration voltage value with which the beam arrival acceleration voltage is the maximum value at which the secondary electron emission efficiency of the specimen becomes 1.

3. The method as claimed in claim 1, further comprising:
    setting the termination acceleration voltage to an acceleration voltage value with which the beam arrival acceleration voltage is placed in an area wherein the secondary electron emission efficiency of the specimen exceeds 1.

4. The method as claimed in claim 1, wherein while the acceleration voltage is dropped, the acceleration voltage is applied continuously or discretely until the specimen charged negatively becomes uncharged or is charged positively.

5. The method as claimed in claim 1, further comprising:
    comparing a plurality of specimens with respect to the maximum beam arrival acceleration voltage; and
    setting the termination acceleration voltage to the lowest value of the maximum beam arrival acceleration voltages or less.

6. The method as claimed in claim 1, further comprising:
    executing at least one simple observation image acquiring function, the simple observation image acquiring function automatically setting a plurality of simple image observation conditions with the acceleration voltage changed, acquiring a simple observation image for each acceleration voltage, and listing the simple observation images on a display;
    determining the maximum acceleration voltage at which the specimen is not charged up on the basis of simple observation images acquired; and
    setting the termination acceleration voltage to the maximum acceleration voltage at which the specimen is not charged up.

7. The method as claimed in claim 1, wherein an area wherein the electron beam is applied to the specimen when the charge elimination is executed is set wider than an area when an observation is executed.

8. The method as claimed in claim 1, wherein an area wherein the electron beam is applied to the specimen when the charge elimination is executed is set to an area wherein a charge-up occurs or a slightly larger area than the area wherein the charge-up occurs.

9. An electron microscope comprising:
    an electron gun for applying an electron beam based on an acceleration voltage to a specimen;
    an acceleration voltage application section for applying the acceleration voltage to said electron gun;
    an acceleration voltage adjustment section for adjusting the acceleration voltage applied to said electron gun;
    a first voltage setting section for recording the maximum value of the acceleration voltages of primary electrons applied to the specimen and setting the maximum acceleration voltage as a start acceleration voltage for an charge elimination; and
    a second voltage setting section for setting an acceleration voltage value with which an arrival acceleration voltage of the electron beam on a specimen face is placed in a range where a secondary electron emission efficiency of the specimen becomes 1 or more as a termination acceleration voltage for the charge elimination,
    wherein when the charge elimination is executed, the acceleration voltage adjustment section gradually drops the acceleration voltage of the electron beam applied to the specimen from the start acceleration voltage to the termination acceleration voltage.

10. The electron microscope as claimed in claim 9, wherein the termination acceleration voltage is set to an acceleration voltage value with which the beam arrival acceleration voltage is the maximum value at which the secondary electron emission efficiency of the specimen becomes 1.

11. The electron microscope as claimed in claim 9, wherein the termination acceleration voltage is set to an acceleration voltage value with which the beam arrival acceleration voltage is placed in an area wherein the secondary electron emission efficiency of the specimen exceeds 1.

* * * * *